United States Patent
Thackston

(10) Patent No.: US 9,196,988 B2
(45) Date of Patent: Nov. 24, 2015

(54) CONNECTOR ASSEMBLY

(71) Applicant: Tyco Electronics Corporation, Berwyn, PA (US)

(72) Inventor: Kevin Michael Thackston, York, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 16 days.

(21) Appl. No.: 14/150,197

(22) Filed: Jan. 8, 2014

(65) Prior Publication Data
US 2015/0194755 A1 Jul. 9, 2015

(51) Int. Cl.

| | |
|---|---|
| H01R 13/64 | (2006.01) |
| H01R 12/91 | (2011.01) |
| H05K 7/20 | (2006.01) |
| H05K 1/14 | (2006.01) |
| H01R 13/631 | (2006.01) |
| H01R 13/74 | (2006.01) |
| H01R 12/73 | (2011.01) |

(52) U.S. Cl.
CPC .............. *H01R 12/91* (2013.01); *H01R 12/737* (2013.01); *H01R 13/631* (2013.01); *H01R 13/6315* (2013.01); *H01R 13/64* (2013.01); *H01R 13/743* (2013.01); *H01R 13/748* (2013.01); *H05K 1/14* (2013.01); *H05K 7/2039* (2013.01)

(58) Field of Classification Search
USPC ............. 439/248, 247, 32, 108, 608, 79, 680, 439/609, 610, 701, 65, 493, 487; 361/712, 361/803
See application file for complete search history.

(56) References Cited

U.S. PATENT DOCUMENTS

| | | | |
|---|---|---|---|
| 5,306,169 A | 4/1994 | Fukushima et al. | |
| 5,429,520 A * | 7/1995 | Morlion et al. | 439/108 |
| 5,433,618 A * | 7/1995 | Morlion et al. | 439/108 |
| 6,409,543 B1 * | 6/2002 | Astbury et al. | 439/607.07 |
| 6,663,426 B2 * | 12/2003 | Hasircoglu et al. | 439/607.07 |
| 6,685,488 B2 * | 2/2004 | Billman et al. | 439/108 |
| 6,979,215 B2 * | 12/2005 | Avery et al. | 439/248 |
| 7,722,401 B2 * | 5/2010 | Kirk et al. | 439/607.07 |

(Continued)

FOREIGN PATENT DOCUMENTS

| | | |
|---|---|---|
| EP | 2451022 A1 | 5/2012 |
| EP | 2642615 A2 | 9/2013 |

OTHER PUBLICATIONS

European Search Report, Mail Date, Jun. 15, 2015, EP 15 15 0351, Application No. 15150351.3-1801.

*Primary Examiner* — Abdullah Riyami
*Assistant Examiner* — Harshad Patel

(57) ABSTRACT

A connector assembly includes a first connector having a first mounting side that extends along a first plane. The first connector is configured to be mounted to a first circuit board along the first mounting side such that the first circuit board extends approximately parallel to the first plane. A second connector is configured to mate with the first connector. The second connector has a second mounting side that extends along a second plane that extends approximately perpendicular to the first plane. The second connector is configured to be mounted to a second circuit board along the second mounting side such that the second circuit board extends approximately parallel to the second plane. The first and second connectors are configured to move relative to each other along a float axis that extends approximately perpendicular to the second plane when the first and second connectors are mated together.

17 Claims, 8 Drawing Sheets

(56) References Cited

U.S. PATENT DOCUMENTS

| | | | |
|---|---|---|---|
| 8,216,001 B2* | 7/2012 | Kirk | 439/676 |
| 2002/0098738 A1* | 7/2002 | Astbury et al. | 439/608 |
| 2010/0240233 A1* | 9/2010 | Johnescu et al. | 439/108 |
| 2011/0007484 A1 | 1/2011 | Schuldt | |
| 2011/0250773 A1* | 10/2011 | Hamner et al. | 439/248 |
| 2012/0202370 A1 | 8/2012 | Mulfinger et al. | |
| 2013/0309910 A1 | 11/2013 | Gulla | |

* cited by examiner

CONNECTOR ASSEMBLY

BACKGROUND OF THE INVENTION

The subject matter described and/or illustrated herein relates generally to connector assemblies, and more particularly, to connector assemblies that interconnect circuit boards.

Electrical connector systems are known for providing an electrical connection between two circuit boards. Specifically, complementary electrical connectors mounted on the circuit boards are mated together to establish an electrical connection between the circuit boards. In some applications, one or both of the circuit boards is connected in thermal communication with a conduction cooling component (e.g., a heat sink, a heat pipe, and/or the like) for cooling the circuit board(s).

But, it may be difficult to establish the thermal communication between the circuit board and the corresponding conduction cooling component after the electrical connectors have been mated together, for example in applications wherein the circuit boards are oriented approximately perpendicular to each other. For example, the circuit board must be brought into engagement in physical contact with the conduction cooling component and/or an intervening thermal interface material (TIM) to connect the circuit board in thermal communication with the conduction cooling component. But, once the electrical connectors have been mated together, the electrical connectors may not be capable of being moved relative to each other sufficiently to move the circuit board into engagement in physical contact with the conduction cooling component and/or the intervening TIM. Accordingly, it may be impossible to sufficiently establish thermal communication between the circuit board and the conduction cooling component, which may lead to malfunction and/or failure of the circuit board from overheating. In some circumstances it may be possible to rotate the electrical connectors relative to each other to move the circuit board into engagement in physical contact with the conduction cooling component and/or the intervening TIM. But, rotating the electrical connectors relative to each other to establish the thermal communication may damage the electrical connectors and/or break the electrical connection between the electrical connectors.

BRIEF DESCRIPTION OF THE INVENTION

In an embodiment, a connector assembly includes a first connector having a first mounting side that extends along a first plane. The first connector is configured to be mounted to a first circuit board along the first mounting side such that the first circuit board extends approximately parallel to the first plane. The connector assembly includes a second connector that is configured to mate with the first connector. The second connector has a second mounting side that extends along a second plane that extends approximately perpendicular to the first plane. The second connector is configured to be mounted to a second circuit board along the second mounting side such that the second circuit board extends approximately parallel to the second plane. The first and second connectors are configured to move relative to each other along a float axis that extends approximately perpendicular to the second plane when the first and second connectors are mated together.

In an embodiment, a connector assembly includes a first connector having a plug, and a second connector having a receptacle. The first and second electrical connectors are configured to mate together such that the plug of the first connector is received within the receptacle of the second connector. The plug or the receptacle comprising a groove that receives a tongue of the other of the plug or the receptacle. The groove extends a depth. The tongue is configured to move within the groove along the depth of the groove such that the first and second connectors are configured to move relative to each other when the first and second connectors are mated together.

In an embodiment, a circuit board assembly includes a first circuit board, a first connector mounted to the first circuit board, a second circuit board that extends approximately perpendicular to the first circuit board, and a second connector mounted to the second circuit board. The second connector is configured to mate with the first connector. When the first and second electrical connectors are mated together, the first and second connectors are configured to move relative to each other along a float axis that extends approximately perpendicular to the second circuit board to move the second circuit board along the float axis relative to the first circuit board.

DETAILED DESCRIPTION OF THE INVENTION

Figure 1:
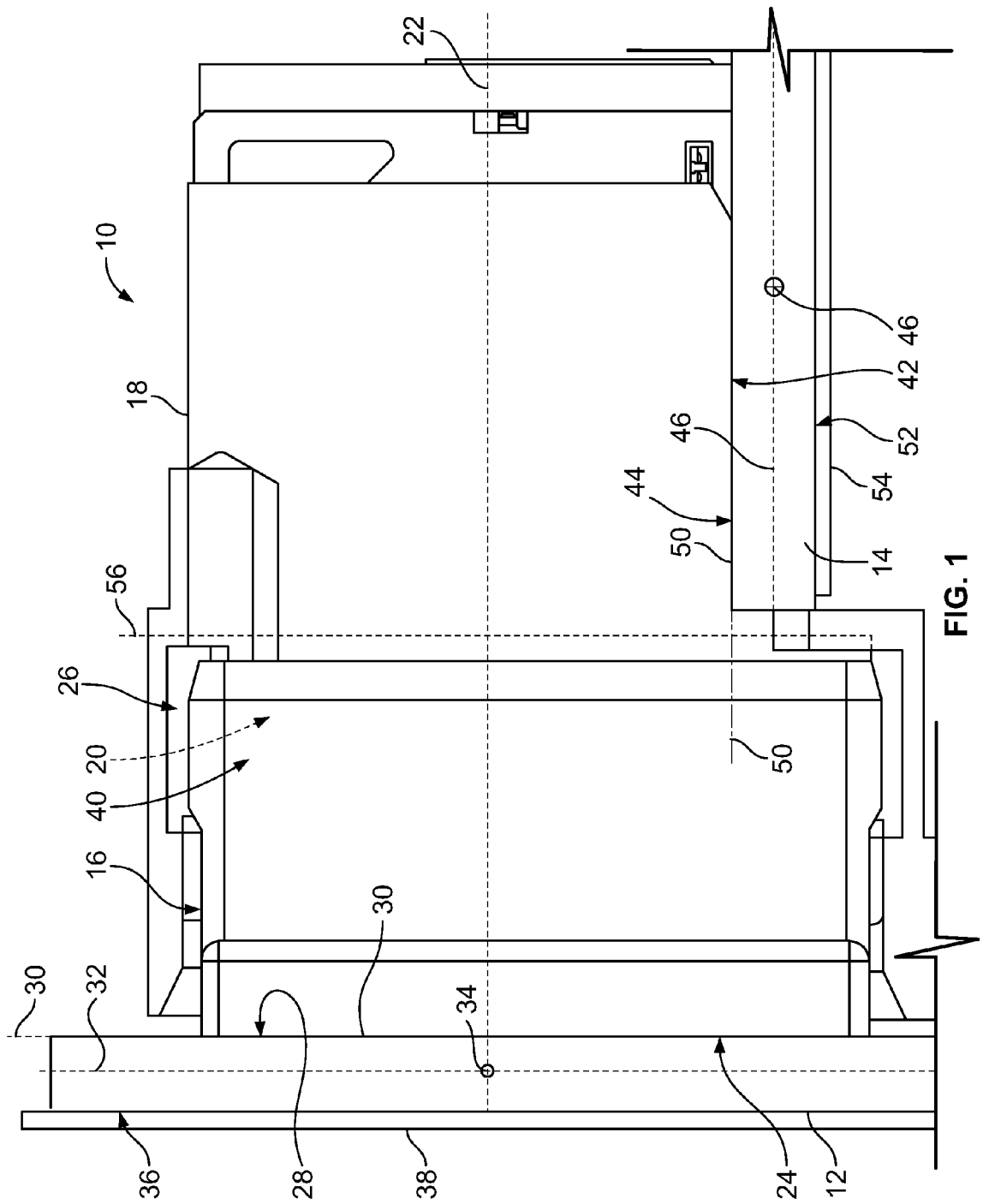
FIG. 1 is an elevational view of a circuit board assembly.

FIG. 1 is an elevational view of an embodiment of a circuit board assembly 10. The circuit board assembly 10 includes circuit boards 12 and 14 and electrical connectors 16 and 18. The electrical connectors 16 and 18 are mounted to the circuit boards 12 and 14, respectively, for electrically connecting the circuit boards 12 and 14 together at a separable mating interface 20. Specifically, the electrical connectors 16 and 18 can be directly mated together at the separable mating interface 20 to establish an electrical connection between the circuit boards 12 and 14. The electrical connectors 16 and 18 may be referred to hereinafter collectively as a "connector assembly". Each of the circuit boards 12 and 14 may be referred to herein as a "first circuit board" and/or a "second circuit board". Each of the electrical connectors 16 and 18 may be referred to herein as a "first connector" and/or a "second connector".

In the illustrated embodiment, the circuit boards 12 and 14 are oriented approximately perpendicular to one another when the electrical connectors 16 and 18 are mated together. Specifically, a central axis 32 of the circuit board 12 extends approximately perpendicular to a central axis 46 of the circuit board 14. Alternative relative orientations of the circuit boards 12 and 14 are possible in alternative embodiments. A mating axis 22 extends through the electrical connectors 16 and 18. The electrical connectors 16 and 18 mate together in a direction parallel to and along the mating axis 22. The circuit board 12 and/or 14 is optionally a motherboard, a daughter card, a line card, a switch card, and/or the like.

The electrical connector 16 includes a mounting side 24 and a mating side 26. The electrical connector 16 mates with the electrical connector 18 along the mating side 26. The electrical connector 16 is mounted to the circuit board 12 along the mounting side 24. Specifically, the electrical connector 16 is mounted to a connector side 28 of the circuit board 16 such that the mounting side 24 of the electrical connector 16 faces the connector side 28 of the circuit board 12. Optionally, the mounting side 24 of the electrical connector 16 is engaged in physical contact with the connector side 28 of the circuit board 12 when the electrical connector 16 is mounted to the circuit board 12. The mounting side 24 of the electrical connector 16 may be referred to herein as a "first mounting side" and/or a "second mounting side".

The mounting side 24 of the electrical connector 16 extends along a plane 30. As shown in FIG. 1, the circuit board 12 extends approximately parallel to the plane 30 when the electrical connector 16 is mounted to the circuit board 12. Specifically, the circuit board 12 includes two central axes 32 and 34 that extend along the width and length, respectively, of the circuit board 12 and that extend approximately perpendicular to each other. As can be seen in FIG. 1, each of the central axes 32 and 34 extends approximately parallel to the plane 30. In the illustrated embodiment, the mounting side 24 of the electrical connector 16 is engaged in physical contact with the connector side 28 of the circuit board 12 such that the plane 30 of the mounting side 24 of the electrical connector 16 is coplanar with the connector side 28 of the circuit board 12. The plane 30 may be referred to herein as a "first plane" and/or a "second plane".

Optionally, a cooling side 36 of the circuit board 12 is in thermal communication with a conduction cooling member 38 for conducting heat from away from the circuit board 12. The conduction cooling member 38 may be any type of conduction cooling member that is configured to conduct heat away from the circuit board 12, such as, but not limited to, a heat sink, a heat pipe, and/or the like. The cooling side 36 of the circuit board 12 may be connected in thermal communication with the conduction cooling member 38 in any manner, such as, but not limited to, via engagement in physical contact with the conduction cooling member 38, via engagement in physical contact with a thermal interface material (TIM; not shown) that is engaged in physical contact with the conduction cooling member 38, and/or the like.

The electrical connector 18 includes a mating side 40 along which the electrical connector 18 mates with the electrical connector 16 and a mounting side 42 along which the electrical connector 18 is mounted to the circuit board 14. The electrical connector 18 is mounted to a connector side 44 of the circuit board 14 such that the mounting side 42 of the electrical connector 18 faces the connector side 44 of the circuit board 14. In the illustrated embodiment, the mounting side 42 of the electrical connector 18 extends approximately parallel to the mating axis 22 such that the circuit board 14 extends approximately parallel to the mating axis 22 when the electrical connector 18 is mounted to the circuit board 14. Specifically, the circuit board 14 includes two central axes 46 and 48 that extend along the width and length, respectively, of the circuit board 14. The central axes 46 and 48 extend approximately perpendicular to each other. As shown in FIG. 1, the central axis 48 of the circuit board 14 extends approximately parallel to the mating axis 22.

Optionally, the mounting side 42 of the electrical connector 18 is engaged in physical contact with the connector side 44 of the circuit board 14 when the electrical connector 18 is mounted to the circuit board 14. The mounting side 42 of the electrical connector 18 may be referred to herein as a "first mounting side" and/or a "second mounting side".

The mounting side 42 of the electrical connector 18 extends along a plane 50. In the illustrated embodiment, and as can be seen in FIG. 1, the mating axis 22 extends approximately parallel to the plane 50. The circuit board 14 extends approximately parallel to the plane 50 when the electrical connector 18 is mounted to the circuit board 14. Specifically, and as shown in FIG. 1, each of the central axes 46 and 48 of the circuit board 14 extends approximately parallel to the plane 50. In the illustrated embodiment, the mounting side 42 of the electrical connector 18 is engaged in physical contact with the connector side 44 of the circuit board 14 such that the plane 50 of the mounting side 42 of the electrical connector 18 is coplanar with the connector side 44 of the circuit board 14. The plane 50 may be referred to herein as a "first plane" and/or a "second plane".

A cooling side 52 of the circuit board 14 is optionally in thermal communication with a conduction cooling member 54 for conducting heat from away from the circuit board 14. The conduction cooling member 54 may be any type of conduction cooling member that is configured to conduct heat away from the circuit board 14, such as, but not limited to, a heat sink, a heat pipe, and/or the like. The cooling side 52 of the circuit board 14 may be connected in thermal communication with the conduction cooling member 54 in any manner, such as, but not limited to, via engagement in physical contact with the conduction cooling member 54, via engagement in physical contact with a thermal interface material (TIM; not shown) that is engaged in physical contact with the conduction cooling member 54, and/or the like.

As will be described in more detail below, the electrical connectors 16 and 18 are configured to move relative to each other along a float axis 56 when the electrical connectors 16 and 18 are mated together. For example, the electrical connectors 16 and 18 may be configured to move relative to each other along the float axis 56 to move the circuit board 14 into thermal communication the conduction cooling member 54 (e.g., into engagement in physical contact with the conduction cooling member 54, into engagement in physical contact with a TIM that is engaged in physical contact with the conduction cooling member 54, and/or the like). As can be seen in FIG. 1, the float axis 56 extends approximately perpendicular to the plane 50 and extends approximately perpendicular to the mating axis 22 in the illustrated embodiment.

Figure 2:
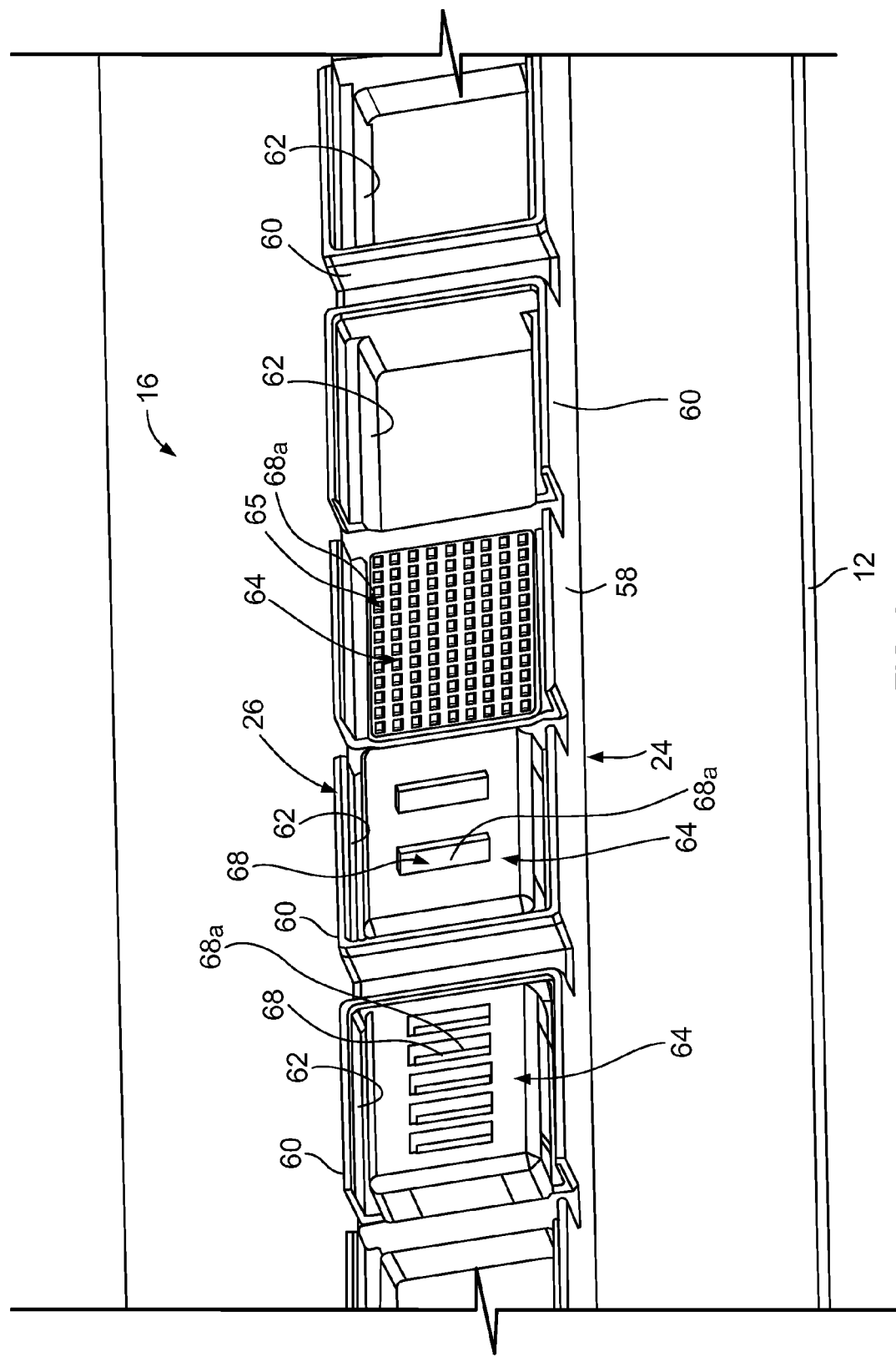
FIG. 2 is a perspective view of an embodiment of an electrical connector of the circuit board assembly shown in FIG. 1.

FIG. 2 is a perspective view of an embodiment of the electrical connector 16. The electrical connector 16 includes a housing 58 that extends from the mating side 26 to the mounting side 24 of the electrical connector 16. The housing 58 includes one or more plugs 60. Each plug 60 includes one or more ports 62. Each port 62 is configured to hold one or more sub-connectors 64 of the electrical connector 16. The housing 58 may include any number of plugs 60 and any number of ports 62. The housing 58 may hold any number of sub-connectors 64. Moreover, each plug 60 may have any number of ports 62 and each port 62 may hold any number of sub-connectors 64. As shown in FIG. 2, some of the ports 62 are empty (i.e., do not hold any sub-connectors 64). Any number of the ports 62 may be empty. In some embodiments, none of the ports 62 are empty such that all of the ports 62 hold at least one sub-connector 64.

Each plug 60 is configured to be received within a corresponding receptacle 66 (FIGS. 6-9) of the electrical connector 18 (FIGS. 1, 6, and 8-10) when the electrical connectors 16 and 18 are mated together. Each sub-connector 64 includes one or more electrical contacts 68 that includes a mating segment 68a and a mounting segment (not shown). The mounting segments extend along the mounting side 24 of the electrical connector 16 and are mounted to the circuit board 12 such that the electrical contacts 68 are electrically connected to the circuit board 12. The mating segments 68a extend along the mating side 24 of the electrical connector 16 and are configured to mate with corresponding electrical contacts 70 (FIGS. 6 and 8) of the electrical connector 18 to establish an electrical connection between the electrical connectors 16 and 18. The electrical contacts 68 of each sub-connector 64 may provide signal, electrical power, and/or electrical ground paths.

Each sub-connector 66 may be any type of electrical connector. In some embodiments, one or more of the sub-connectors 66 includes one or more contact modules that includes a lead frame that is held by a dielectric carrier (e.g., an overmold and/or the like). The housing 58 of the electrical connector 16 may hold a plurality of a single type of sub-connectors 66 in some embodiments, while the housing 58 may hold two or more different types of sub-connectors 66 as is shown in the illustrated embodiment.

Figure 3:
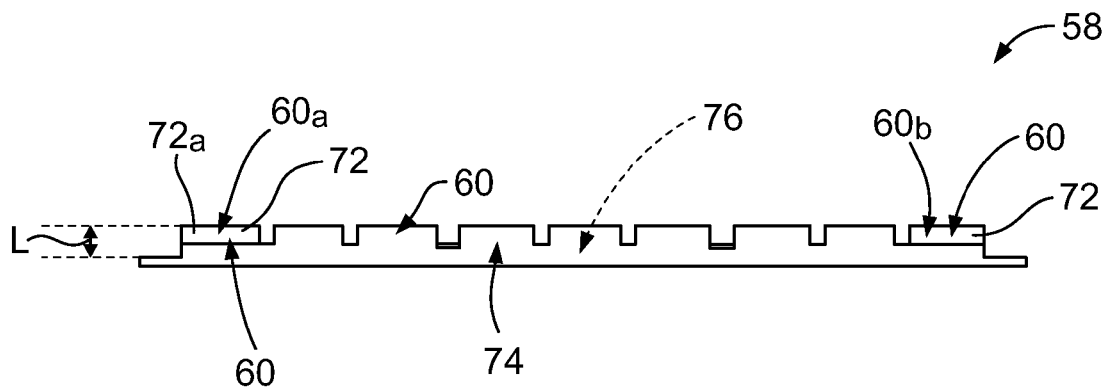
FIG. 3 is an elevational view of an embodiment of a housing of the electrical connector shown in FIG. 2.
Figure 4:
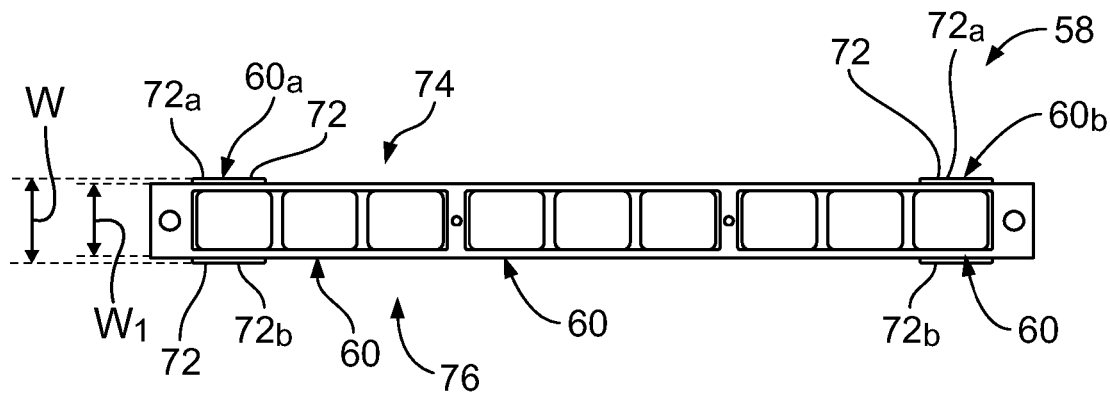
FIG. 4 is a plan view of the housing shown in FIG. 3.
Figure 5:
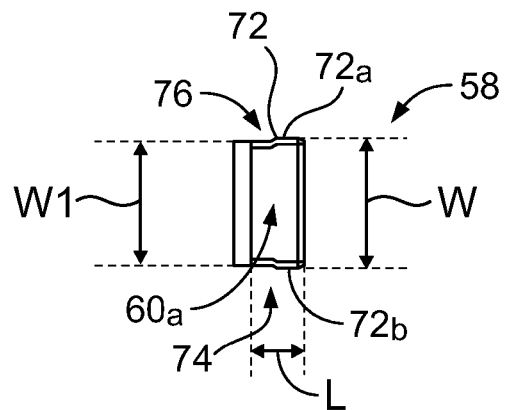
FIG. 5 is a side view of the housing shown in FIGS. 3 and 4.

FIG. 3 is an elevational view of an embodiment of the housing 58 of the electrical connector 16. FIG. 4 is a plan view of the housing 58. FIG. 5 is a side view of the housing 58. Referring now to FIGS. 3-5, in the illustrated embodiment, one or more of the plugs 60 of the housing 58 includes a tongue 72 that extends along at least a portion (and at any location(s)) of a length L (not labeled in FIG. 4) of the plug 60. The tongue 72 extends outward along one or more sides 74 and 76 of the housing 58 such that the tongue 72 defines an increased width W (not labeled in FIG. 3) of the plug 60. Specifically, the illustrated embodiment of the tongue 72 includes two sub-tongues 72a and 72b that extend outward on respective sides 74 and 76 of the housing 58. The sub-tongues 72a and 72b provide the plug 60 with the width W, which is increased relative to the width $W_1$ of other segments of the plug 60 along which the tongue 72 does not extend and relative to the width $W_1$ of plugs 60 (if any) that do not include the tongue 72. In some other embodiments, the tongue 72 only includes one of the sub-tongues 72a or 72b. Moreover, although the tongue 72 is shown as extending along only a portion of the length L of the plug 60, the tongue 72 may extend along an approximate entirety of the length L of the plug 60. As shown in FIGS. 4 and 5, the width W of the plug(s) 60 that include the tongue 72 extends along the float axis 56.

In the illustrated embodiment, only plugs 60a and 60b that extend at opposite ends 78 and 80 of the housing 58 include the tongue 72. But, any other plugs 60 of the housing 58 may include the tongue 72 in addition or alternatively to the plugs 60a and 60b. Moreover, any number of the plugs 60 may include the tongue 72. In some embodiments, all of the plugs 60 include the tongue 72.

As will be described below, the tongue 72 is configured to be received within a corresponding groove 82 (FIGS. 7-10) of the electrical connector 18 (FIGS. 1, 6, and 8-10) to enable the electrical connectors 16 and 18 to move along the float axis 56 when the electrical connectors 16 and 18 are mated together.

Figure 6:
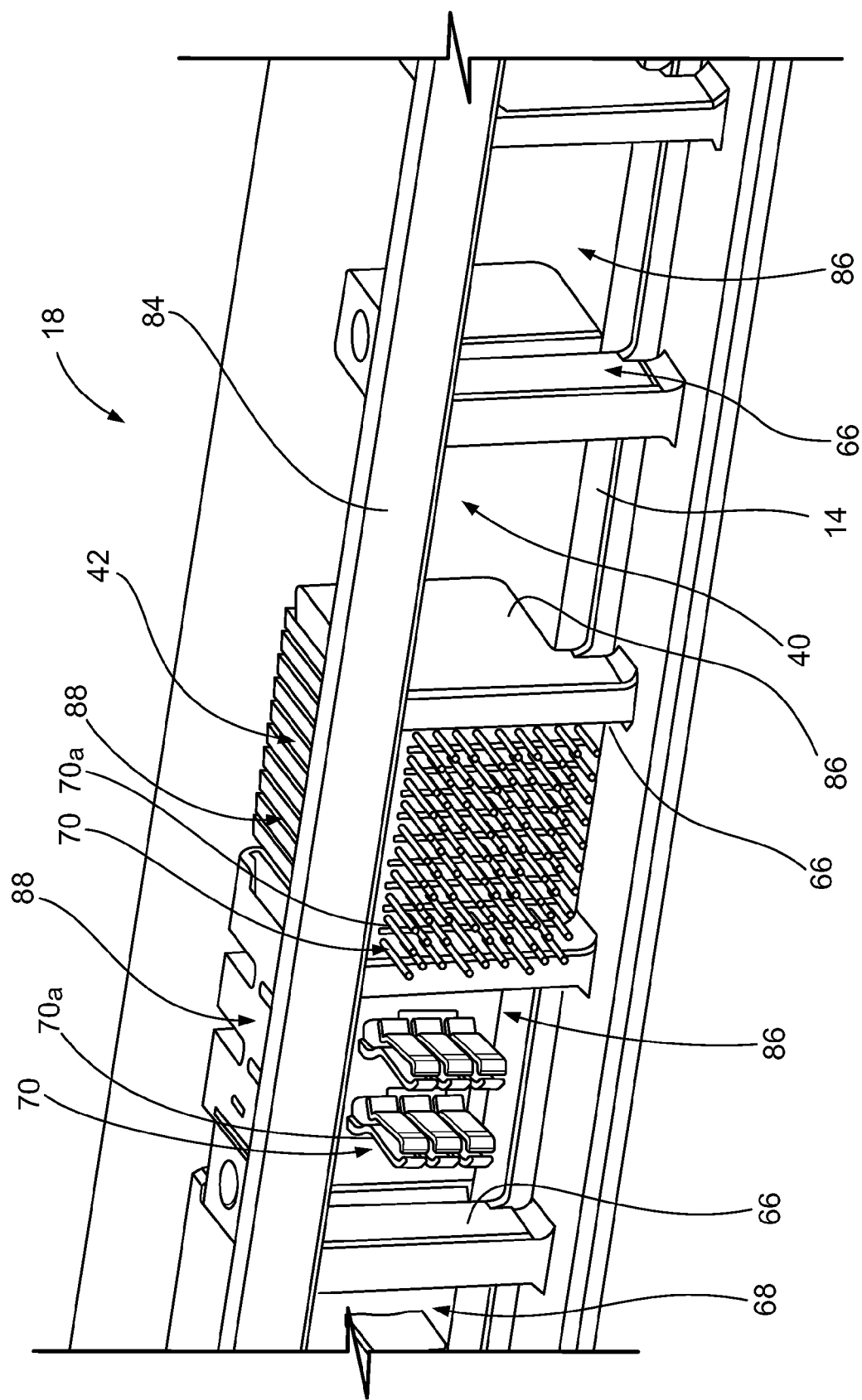
FIG. 6 is a perspective view of an embodiment of another electrical connector of the circuit board assembly shown in FIG. 1.

FIG. 6 is a perspective view of an embodiment of the electrical connector 18. The electrical connector 18 includes a housing 84 that extends from the mating side 40 to the mounting side 42 of the electrical connector 18. The housing 84 includes one or more of the receptacles 66. Each receptacle 66 includes one or more ports 86. Each port 86 is configured to hold one or more sub-connectors 88 of the electrical connector 18. The housing 84 may include any number of receptacles 66 and any number of ports 86. The housing 84 may hold any number of sub-connectors 88. Moreover, each receptacle 66 may have any number of ports 86 and each port 86 may hold any number of sub-connectors 88. As shown in FIG. 6, some of the ports 86 are empty (i.e., do not hold any sub-connectors 88). Any number of the ports 86 may be empty. In some embodiments, none of the ports 86 are empty such that all of the ports 86 hold at least one sub-connector 88.

Each receptacle 66 is configured to receive a corresponding plug 60 (FIGS. 2-5 and 8-10) of the electrical connector 16 (FIGS. 1, 2, and 8-10) when the electrical connectors 16 and 18 are mated together. Each sub-connector 88 of the electrical connector 18 is mated with a corresponding sub-connector 66 (FIGS. 2 and 8) of the electrical connector 16 when the electrical connectors 16 and 18 are mated together. In some other embodiments, the electrical connector 18 includes the plug(s) 60 and the electrical connector 16 includes the receptacle(s) 66. Moreover, in some other embodiments, the electrical connectors 16 and 18 each include one or more plugs 60 and one or more receptacles 66.

Each sub-connector 88 includes one or more of the electrical contacts 70, which includes a mating segment 70a and a mounting segment (not shown). The mounting segments extend along the mounting side 42 of the electrical connector 18 and are mounted to the circuit board 14 such that the electrical contacts 70 are electrically connected to the circuit board 14. The mating segments 70a extend along the mating side 40 of the electrical connector 18 and are configured to mate with corresponding electrical contacts 68 (FIGS. 2 and 8) of the corresponding sub-connector 66 of the electrical connector 18 to establish an electrical connection between the electrical connectors 16 and 18. The electrical contacts 70 of each sub-connector 88 may provide signal, electrical power, and/or electrical ground paths.

Each sub-connector 88 may be any type of electrical connector. In some embodiments, one or more of the sub-connectors 88 includes one or more contact modules that includes a lead frame that is held by a dielectric carrier (e.g., an overmold and/or the like). The housing 84 of the electrical connector 18 may hold a plurality of a single type of sub-connectors 88 in some embodiments, while the housing 58 may hold two or more different types of sub-connectors 88 as is shown in the illustrated embodiment.

Figure 7:
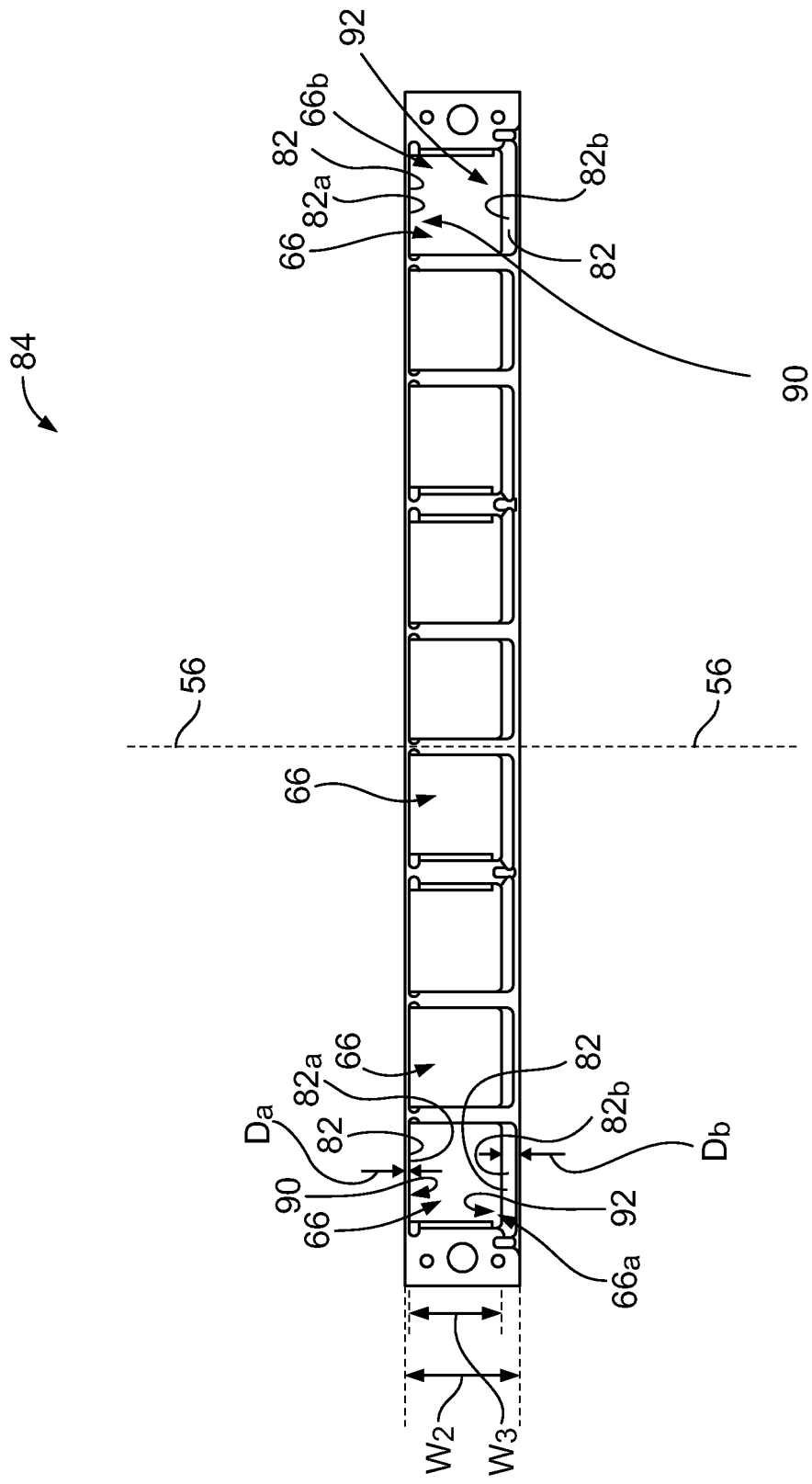
FIG. 7 is a plan view of an embodiment of a housing of the electrical connector shown in FIG. 6.

FIG. 7 is a plan view of an embodiment of the housing 84 of the electrical connector 18. In the illustrated embodiment, one or more of the receptacles 66 of the housing 84 includes one or more of the grooves 82. In some other embodiments, the plugs 60 (FIGS. 2-5 and 8-10) include the groove(s) 82 and the receptacles 66 include the tongue(s) 72. Each groove 82 extends into one or more sides 90 and 92 of the receptacle 66 such that the groove 82 defines an increased width $W_2$ of the receptacle 66. Specifically, the illustrated embodiment of the groove 82 includes two sub-grooves 82a and 82b that extend respective depths $D_a$ and $D_b$ into respective sides 90 and 92 of the receptacle 66. The sub-grooves 82a and 82b provide the receptacle 66 with the width $W_2$, which is increased relative to the width $W_3$ of other segments of the receptacle 66 along which the groove 82 does not extend and relative to the width $W_3$ of receptacles 66 (if any) that do not include the groove 82. In some other embodiments, the groove 82 only includes one of the sub-grooves 82a or 82b.

Moreover, although the groove 82 is shown as extending along only a portion of the length (extending into the page in FIG. 7) of the receptacle 66, the groove 82 may extend along an approximate entirety of the length of the receptacle 66. As shown in FIG. 7, the width $W_2$ of the receptacle(s) 66 that includes the groove 82 extends along the float axis 56. Each of the depths $D_a$ and $D_b$ may have any value and any value relative to each other. In the illustrated embodiment, the depths $D_b$ of the sub-groove 82b is greater than the depth $D_a$ of the sub-groove 82a.

In the illustrated embodiment, only receptacles 66a and 66b that extend at opposite ends 94 and 96 of the housing 84 include the groove 82. But, any other receptacles 66 of the housing 84 may include the groove 82 in addition or alternatively to the receptacles 66a and 66b. Moreover, any number of the receptacles 66 may include the groove 82. In some embodiments, all of the receptacles 66 include the groove 82.

Figure 8:
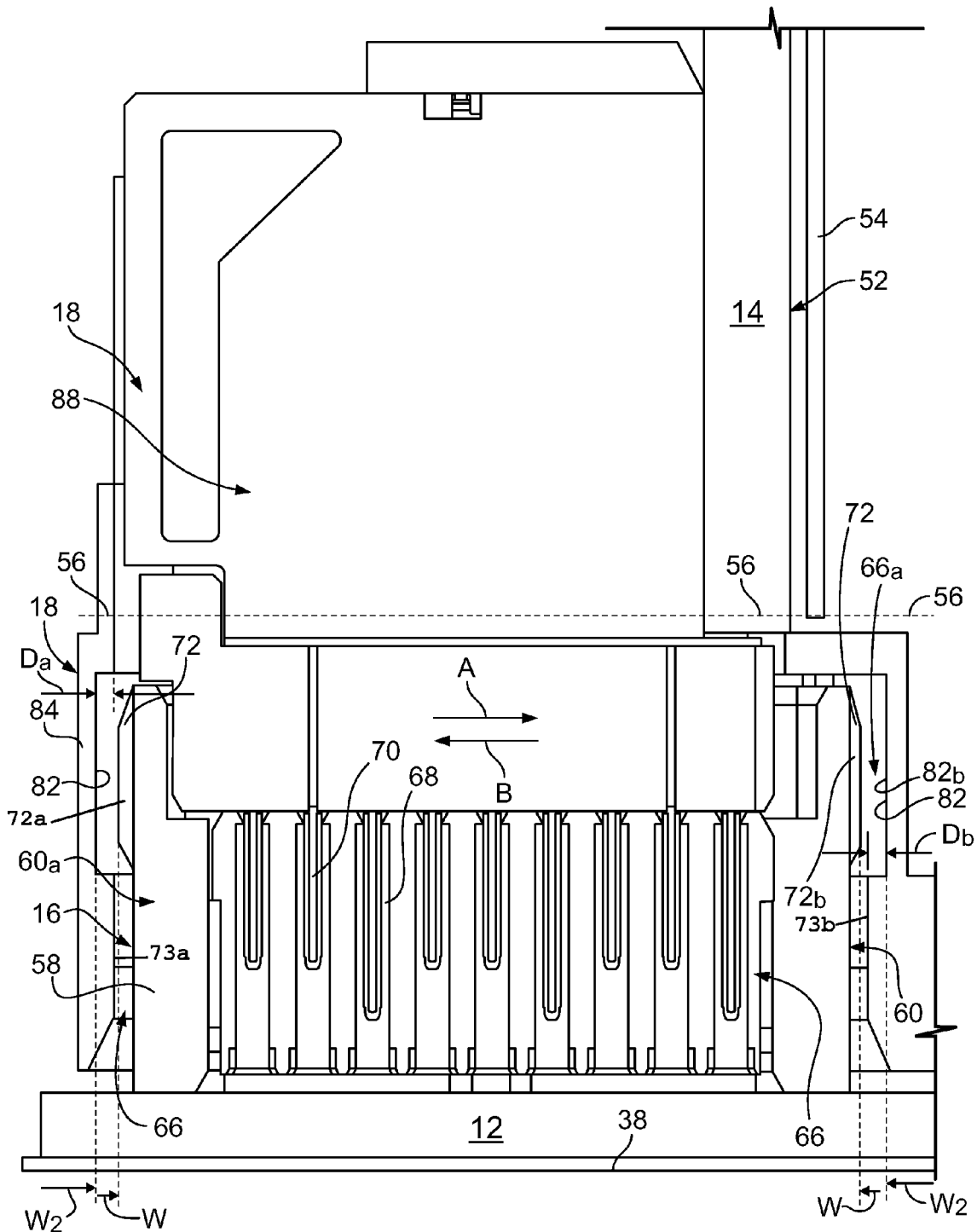
FIG. 8 is a cross-sectional view of the circuit board assembly shown in FIG. 1 illustrating the electrical connectors shown in FIGS. 2 and 6 as mated together.

FIG. 8 is a cross-sectional view of the circuit board assembly 10 illustrating the electrical connectors 16 and 18 as mated together. As shown in FIG. 8, the plugs 60 of the housing 58 of the electrical connector 16 are received within the receptacles 66 of the housing 84 of the electrical connector 18. Specifically, FIG. 8 illustrates the plug 60a of the electrical connector 16 as received within the receptacle 66a of the electrical connector 18. The electrical contacts 68 of the sub-connectors 66 of the electrical connector 16 are mated with the electrical contacts 70 of the sub-connectors 88 of the electrical connector 18 such that the electrical connectors 16 and 18 establish an electrical connection between the circuit boards 12 and 14.

As should be apparent from FIG. 8, during mating of the electrical connectors 16 and 18 together, the sub-tongues 72a and 72b of the electrical connector 16 engage in physical contact with respective alignment surfaces 73a and 73b of the electrical connector 18 to facilitate alignment of the electrical contacts 68 of the electrical connector and the electrical contacts 70 of the electrical connector 18. Once the electrical connectors 16 and 18 have been fully mated together as shown in FIG. 8, the sub-tongues 72a and 72b have cleared the alignment surfaces 73a and 73b, respectively, such that the electrical connectors 16 and 18 can move relative to each other along the float axis 56 as described below.

As shown in FIG. 8, the cooling side 52 of the circuit board 14 is spaced apart from the conduction cooling member 54 such that the circuit board 14 and the conduction cooling member 54 are not connected in thermal communication. In the position shown in FIG. 8 wherein the circuit board 14 and the conduction cooling member 54 are not connected in thermal communication, the conduction cooling member 54 is not configured to conduct heat away from the circuit board 14.

As briefly described above, the electrical connectors 16 and 18 are configured to move relative to each other along the float axis 56 when the electrical connectors 16 and 18 are mated together. For example, the electrical connectors 16 and 18 may be configured to move relative to each other along the float axis 56 to move the circuit board 14 into thermal communication with the conduction cooling member 54. The plugs 60a and 60b are configured to move within the respective receptacles 66a and 66b along the float axis 56 when the electrical connectors 16 and 18 are mated together to move the electrical connectors 16 and 18 relative to each other along the float axis 56. Specifically, the width $W_2$ of the receptacles 66a and 66b is greater than the width $W$ of the plugs 60a and 60b such that the plugs 60a and 60b are configured to move within the respective receptacles 66a and 66b along the float axis 56. Moreover, as should be apparent from FIG. 8, the tongue 72 is configured to move within the groove 82 along the depth (e.g., the depths $D_a$ and/or $D_b$) of the groove 82 to move the electrical connectors 16 and 18 relative to each other along the float axis 56 in the directions of the arrows A and B. The electrical connectors 16 and 18 can thus be moved relative to each other along the float axis 56 to move the circuit board 14 into thermal communication with the conduction cooling member 54.

One specific example of moving the electrical connectors 16 and 18 relative to each other along the float axis 56 to thereby move the circuit board 14 into thermal communication with the conduction cooling member 54 will now be described with reference to FIGS. 8 and 9. From the relative position shown in FIG. 8, the electrical connector 18 can be moved along the float axis 56 relative to the electrical connector 16 in the direction of the arrow A such that the sub-tongue 72b of the plug 60a of the electrical connector 16 is received into the sub-groove 82b of the receptacle 66a. The sub-tongue 72b of the plug 60a is moved along the depth $D_b$ of the sub-groove 82b in the direction of the arrow A to thereby move the circuit board 14 along the float axis 56 in the direction of the arrow A relative to the electrical connector 16 and the circuit board 12. The electrical connector 18 and circuit board 14 are moved along the float axis 56 in the direction of the arrow A until the electrical connector 18 is in the relative position shown in FIG. 9 wherein the cooling side 52 of the circuit board 14 is connected in thermal communication with the conduction cooling component 54. For example, the cooling side 52 of the circuit board 14 may be engaged in physical contact with the conduction cooling member 54 and/or engaged in physical contact with a TIM (not shown) that extends between the conduction cooling member 54 and the cooling side 52 of the circuit board 14 to connect the circuit board 14 in thermal communication with the conduction cooling member 54. Movement of the plug 60b (FIGS. 3 and 4) of the electrical connector 16 within the receptacle 66b (FIG. 7) of the electrical connector 18 to move the circuit board 14 in the direction of the arrow A is substantially similar to the movement of the plug 60a within the receptacle 66a and therefore will not be described or illustrated in more detail herein.

Figure 9:
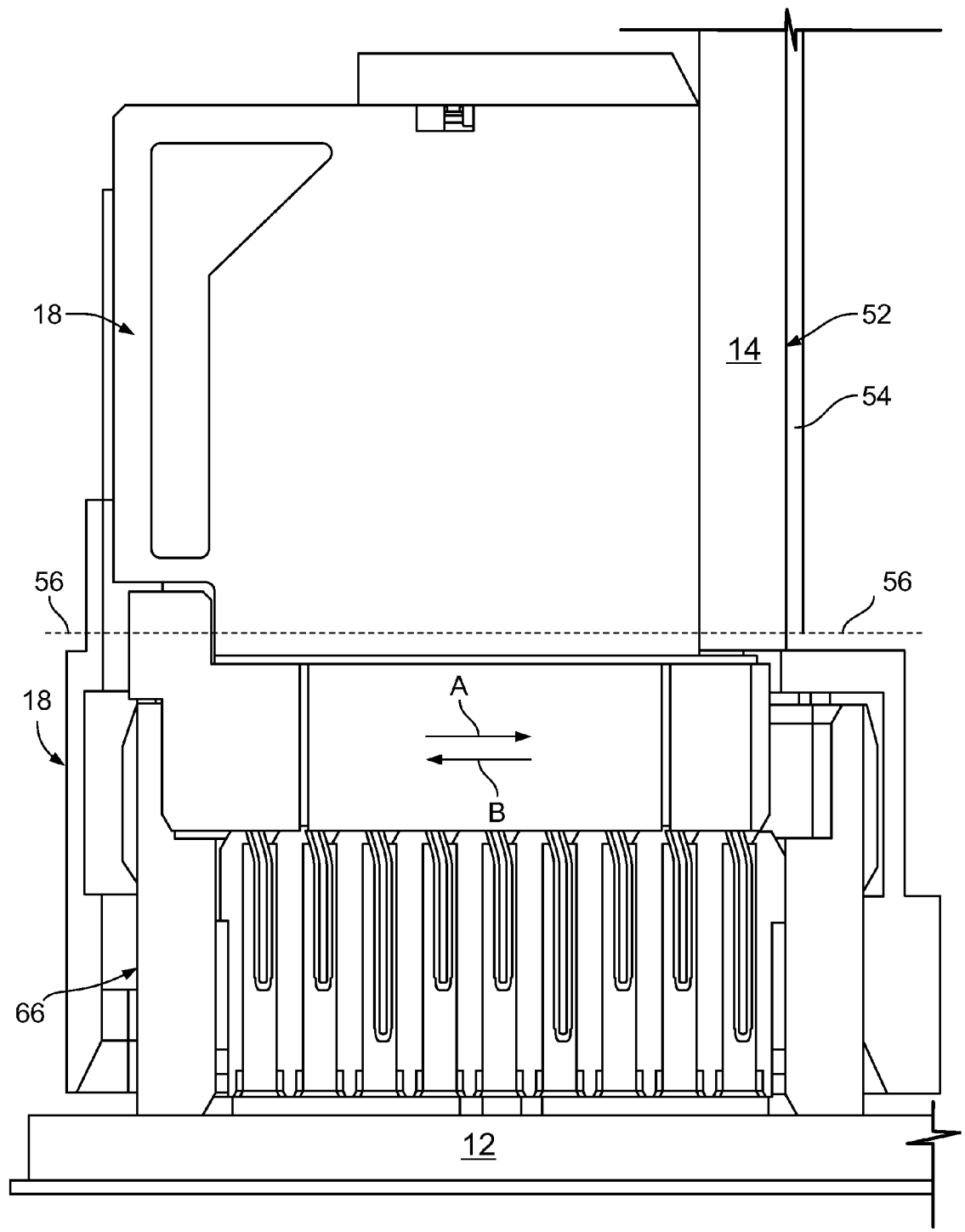
FIG. 9 is another cross-sectional view of the circuit board assembly shown in FIG. 1 illustrating the electrical connectors shown in FIGS. 2 and 6 as mated together.
Figure 10:
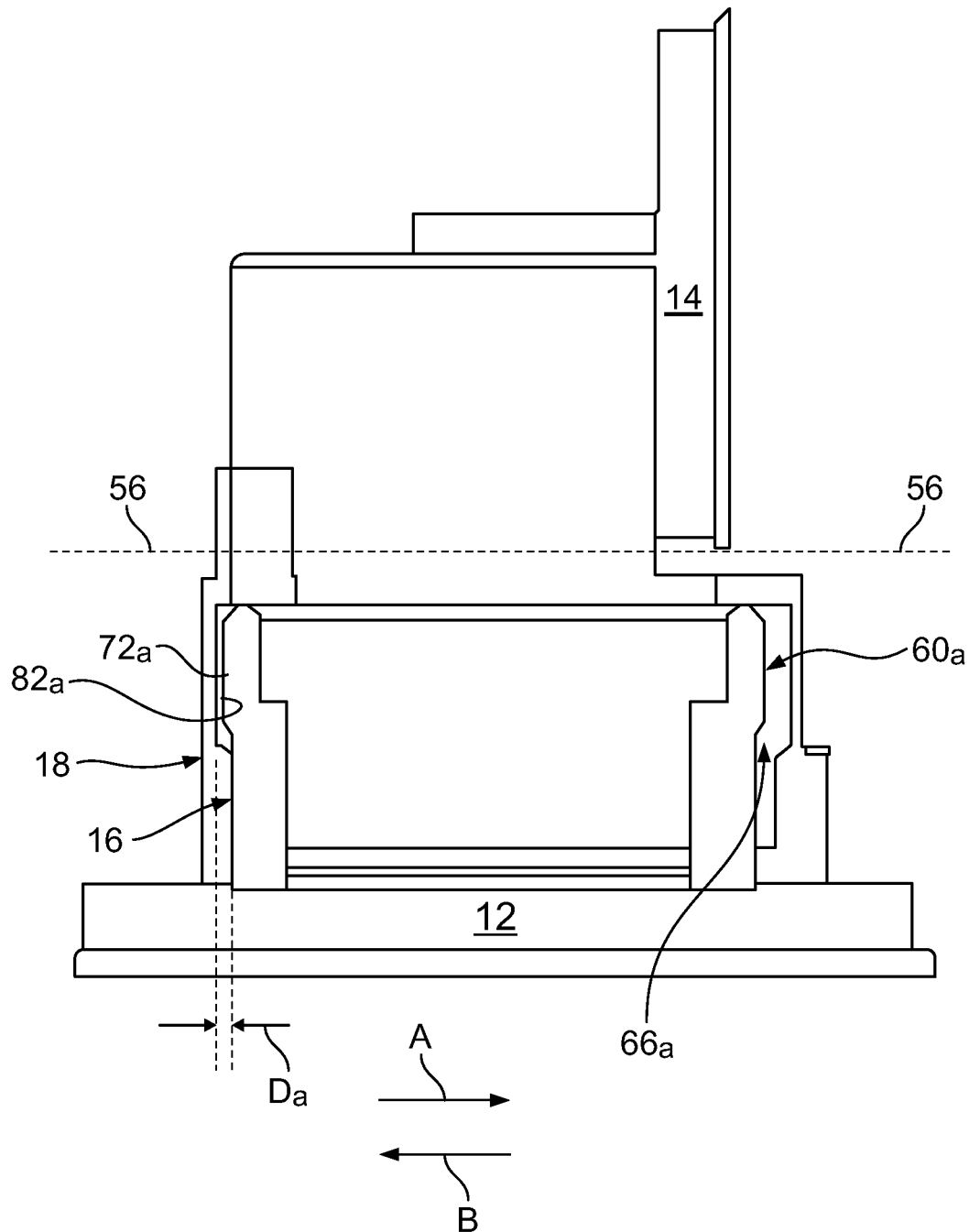
FIG. 10 is yet another cross-sectional view of the circuit board assembly shown in FIG. 1 illustrating the electrical connectors shown in FIGS. 2 and 6 as mated together.

It should be apparent from FIGS. 8 and 9 that the electrical connector 18 and the circuit board 14 can be moved along the float axis 56 from the relative position shown in FIG. 8 in the direction of the arrow B. FIG. 10 illustrates the electrical connectors 16 and 18 as mated together wherein the sub-tongue 72a of the plug 60a has been moved along the depth $D_a$ of the sub-groove 82a of the receptacle 66a in the direction of the arrow B such that the electrical connector 18 and the circuit board 14 have been moved along the float axis 56 in the direction of the arrow B relative to the electrical connector 16 and the circuit board 12.

The embodiments described and/or illustrated herein may provide a circuit board assembly wherein it is less difficult to establish thermal communication between a circuit board and a corresponding conduction cooling component after electrical connectors of the circuit board assembly have been mated together.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
  a first connector having a first mounting side that extends along a first plane, the first connector being configured to be mounted to a first circuit board along the first mounting side such that the first circuit board extends approximately parallel to the first plane; and
  a second connector configured to mate with the first connector, the second connector having a second mounting side that extends along a second plane that extends approximately perpendicular to the first plane, the second connector being configured to be mounted to a second circuit board along the second mounting side such that the second circuit board extends approximately parallel to the second plane, wherein the first and second connectors are configured to move relative to each other along a float axis that extends approximately perpendicular to the second plane when the first and second connectors are mated together; and wherein the second connector is configured to move relative to the first connector along the float axis when the first and second connectors are mated together to move the second circuit board into thermal communication with a conduction cooling member.

2. The connector assembly of claim 1, wherein the second connector is configured to move relative to the first connector along the float axis when the first and second connectors are mated together to move the second circuit board along the float axis.

3. The connector assembly of claim 1, wherein one of the first connector and the second connector comprises a plug that is received within a receptacle of the other of the first connector and the second connector when the first and second connectors are mated together, the plug being configured to move within the receptacle along the float axis when the first and second connectors are mated together.

4. The connector assembly of claim 1, wherein one of the first connector and the second connector comprises a plug that is received within a receptacle of the other of the first connector and the second connector when the first and second connectors are mated together, the plug or the receptacle comprising a groove that receives a tongue of the other of the plug or the receptacle, the groove extending a depth, the tongue being configured to move within the groove along the depth of the groove to move the first and second connectors relative to each other along the float axis when the first and second connectors are mated together.

5. The connector assembly of claim 1, wherein one of the first connector and the second connector comprises a plug that is received within a receptacle of the other of the first connector and the second connector when the first and second connectors are mated together, the plug having a width that extends along the float axis, the receptacle having a width that extends along the float axis, the width of the receptacle being greater than the width of the plug such that the plug is configured to move within the receptacle along the float axis when the first and second connectors are mated together.

6. The connector assembly of claim 1, wherein the first and second connectors are configured to mate together along a mating axis, the second mounting side of the second connector extending approximately parallel to the mating axis such that the second circuit board extends approximately parallel to the mating axis when the second connector is mounted to the second circuit board.

7. The connector assembly of claim 1, wherein the first and second connectors are configured to mate together along a mating axis that extends approximately parallel to the second plane, the float axis extending approximately perpendicular to the mating axis.

8. A connector assembly comprising:
  a first connector comprising a plug; and
  a second connector comprising a receptacle, the first and second electrical connectors being configured to mate together such that the plug of the first connector is received within the receptacle of the second connector, the plug or the receptacle comprising a groove that receives a tongue of the other of the plug or the receptacle, the groove extending a depth, wherein the tongue is configured to move within the groove along the depth of the groove such that the first and second connectors are configured to move relative to each other when the first and second connectors are mated together; and the second connector is configured to be mounted to a circuit board, the second connector being configured to move relative to the first connector when the first and second connectors are mated together to move the second circuit board into thermal communication with a conduction cooling member.

9. The connector assembly of claim 8, wherein the first connector is configured to be mounted to a first circuit board, the second connector being configured to be mounted to a second circuit board that extends approximately perpendicular to the first circuit board, the first and second connectors being configured to move relative to each other when the first and second connectors are mated together along a float axis that extends approximately perpendicular to the second circuit board.

10. The connector assembly of claim 8, wherein the second connector is configured to be mounted to a circuit board, the second connector being configured to move relative to the first connector when the first and second connectors are mated together to move the second circuit board relative to the first connector.

11. The connector assembly of claim 8, wherein the first and second connectors are configured to mate together along a mating axis, the first and second connectors being configured to move relative to each other when the first and second connectors are mated together along a float axis that extends approximately perpendicular to the mating axis.

12. A circuit board assembly comprising:
  a first circuit board;
  a first connector mounted to the first circuit board;
  a second circuit board that extends approximately perpendicular to the first circuit board; and
  a second connector mounted to the second circuit board, the second connector being configured to mate with the first connector, wherein, when the first and second electrical connectors are mated together, the first and second connectors are configured to move relative to each other along a float axis that extends approximately perpendicular to the second circuit board to move the second circuit board along the float axis relative to the first circuit board; and wherein the second connector is configured to move relative to the first connector along the float axis when the first and second connectors are mated together to move the second circuit board into thermal communication with a conduction cooling member.

13. The circuit board assembly of claim 12, wherein one of the first connector and the second connector comprises a plug that is received within a receptacle of the other of the first connector and the second connector when the first and second connectors are mated together, the plug being configured to move within the receptacle along the float axis when the first and second connectors are mated together.

14. The circuit board assembly of claim 12, wherein one of the first connector and the second connector comprises a plug that is received within a receptacle of the other of the first connector and the second connector when the first and second connectors are mated together, the plug or the receptacle comprising a groove that receives a tongue of the other of the plug or the receptacle, the groove extending a depth, the tongue being configured to move within the groove along the depth of the groove to move the first and second connectors relative to each other along the float axis when the first and second connectors are mated together.

15. The circuit board assembly of claim 12, wherein one of the first connector and the second connector comprises a plug that is received within a receptacle of the other of the first connector and the second connector when the first and second connectors are mated together, the plug having a width that extends along the float axis, the receptacle having a width that extends along the float axis, the width of the receptacle being greater than the width of the plug such that the plug is configured to move within the receptacle along the float axis when the first and second connectors are mated together.

16. The circuit board assembly of claim 12, wherein the first and second connectors are configured to mate together along a mating axis, the second circuit board extending approximately parallel to the mating axis.

17. The circuit board assembly of claim 12, wherein the first and second connectors are configured to mate together along a mating axis that extends approximately parallel to the second circuit board, the float axis extending approximately perpendicular to the mating axis.

* * * * *